(12) United States Patent
Shih et al.

(10) Patent No.: US 8,110,964 B2
(45) Date of Patent: Feb. 7, 2012

(54) ENERGY HARVESTING DEVICE

(75) Inventors: Wei-Heng Shih, Bryn Mawr, PA (US);
Wan Y. Shih, Bryn Mawr, PA (US);
Hakki Yegingil, Philadelphia, PA (US)

(73) Assignee: Drexel University, Philadelphia, PA (US)

( * ) Notice: Subject to any disclaimer, the term of this patent is extended or adjusted under 35 U.S.C. 154(b) by 20 days.

(21) Appl. No.: 12/523,969

(22) PCT Filed: Jan. 29, 2008

(86) PCT No.: PCT/US2008/052292
§ 371 (c)(1),
(2), (4) Date: Oct. 21, 2009

(87) PCT Pub. No.: WO2008/121429
PCT Pub. Date: Oct. 9, 2008

(65) Prior Publication Data
US 2010/0148519 A1    Jun. 17, 2010

Related U.S. Application Data

(60) Provisional application No. 60/887,051, filed on Jan. 29, 2007.

(51) Int. Cl.
*H01L 41/08* (2006.01)
(52) U.S. Cl. ....................................................... 310/339
(58) Field of Classification Search .......... 310/330–332, 310/339
See application file for complete search history.

(56) References Cited

U.S. PATENT DOCUMENTS

| 5,138,216 | A | * | 8/1992 | Woodruff et al. | ........ 310/316.01 |
| 5,751,091 | A | | 5/1998 | Takahashi et al. | |
| 5,756,147 | A | | 5/1998 | Wu et al. | |
| 5,801,475 | A | | 9/1998 | Kimura | |
| 5,811,913 | A | | 9/1998 | Kawai | |
| 6,737,789 | B2 | | 5/2004 | Radziemski et al. | |
| 6,806,624 | B2 | * | 10/2004 | Lee et al. | ........ 310/339 |
| 6,858,970 | B2 | | 2/2005 | Malkin et al. | |
| 6,995,496 | B1 | | 2/2006 | Hagood, IV et al. | |
| 7,084,554 | B2 | * | 8/2006 | Xu et al. | ........ 310/332 |
| 7,116,036 | B2 | | 10/2006 | Balasubramaniam et al. | |
| 7,821,183 | B2 | * | 10/2010 | Rastegar | ........ 310/339 |
| 2002/0043895 | A1 | * | 4/2002 | Richards et al. | ........ 310/328 |

(Continued)

FOREIGN PATENT DOCUMENTS

GB    2326275 A    12/1998
(Continued)

OTHER PUBLICATIONS

Hwang, Il-Han et al., "Self-actuating biosensor using a piezoelectric cantilever and its optimization", Journal of Physics: Conference Series 34, pp. 362-367, 2006.

(Continued)

*Primary Examiner* — Thomas Dougherty
(74) *Attorney, Agent, or Firm* — Knoble Yoshida & Dunleavy, LLC (57) ABSTRACT

A piezoelectric energy harvesting device (PEHD) comprising a driving element, conducting element, piezoelectric layer and non-piezoelectric layer capable of converting ambient mechanical energy into electrical energy. The piezoelectric layer may be constructed from PMN-PT or PZT having a thickness of about 1-150 ?m. The PEHD may be used to generate about 1 W. The harvested energy may be stored and used to power microelectronic devices and rechargeable battery technologies.

20 Claims, 6 Drawing Sheets

U.S. PATENT DOCUMENTS

| | | | |
|---|---|---|---|
| 2005/0120527 A1 | 6/2005 | Tanielian | |
| 2005/0225213 A1* | 10/2005 | Richards et al. | 310/339 |
| 2005/0277852 A1* | 12/2005 | Shih et al. | 600/587 |
| 2005/0280561 A1* | 12/2005 | Face et al. | 341/34 |
| 2006/0022555 A1 | 2/2006 | Balasubramaniam et al. | |
| 2006/0223691 A1 | 10/2006 | Shih et al. | |
| 2007/0089515 A1* | 4/2007 | Shih et al. | 73/579 |
| 2007/0273244 A1* | 11/2007 | Lal et al. | 310/311 |
| 2008/0074002 A1* | 3/2008 | Priya et al. | 310/339 |
| 2009/0007645 A1* | 1/2009 | Shih et al. | 73/105 |

FOREIGN PATENT DOCUMENTS

| | | |
|---|---|---|
| KR | 1019990004764 A | 1/1999 |
| WO | WO/2005/043126 A2 * | 5/2005 |
| WO | 2009/079154 A2 | 6/2009 |

OTHER PUBLICATIONS

Jeon, Y.B. et al., "MEMS power generator with transverse mode thin film PZT", Sensors and Actuators A, vol. 122, pp. 16-22, 2005.

Kim, Hyeong W. et al., "Energy Harvesting Using a Piezoelectric "Cymbal" Transducer in Dynamic Environment", Japanese J. Applied Physics, vol. 43, No. 9A, pp. 6178-6183, 2004.

Lee, Jeong H. et al., "Immunoassay of prostate-specific antigen (PSA) using resonant frequency shift of piezoelectric nanomechanical microcantilever", Biosensors and Bioelectronics, vol. 20, pp. 2157-2162, 2005.

Lee, Yeolho et al., "A Piezoelectric Micro-Cantilever Bio-Sensor Using the Mass-Microbalancing Technique With Self-Excitation", The 13th International Conference on Solid-State Sensors, Actuators, and Microsystems, Seoul, Korea, pp. 644-647, Jun. 5-9, 2005.

Martin, Benjamin R., "Energy Harvesting Applications of Ionic Polymers", Thesis Submitted to the Faculty of the Virginia Polytechnic Institute and State University, Apr. 22, 2005.

Priya, Shashank et al., "Piezoelectric Windmill: A Novel Solution to Remote Sensing", Japanese J. Applied Physics, vol. 44, No. 3, pp. L 104-L 107, 2005.

Roundy, S. et al., "A piezoelectric vibration based generator for wireless electronics", Smart Mater. Struct., vol. 13, pp. 1131-1142, 2004.

Roundy, Shad et al., "Improving Power Output for Vibration-Based Energy Scavengers", Energy Harvesting and Conservation, pp. 28-36, Jan.-Mar. 2005.

Sodano, Henry A., "Macro-Fiber Composites for Sensing, Actuation and Power Generation", Thesis Submitted to the Faculty of the Virginia Polytechnic Institute and State University, Jul. 28, 2003.

Sodano, Henry A. et al., "Use of piezoelectric energy harvesting devices for charging batteries", Smart Structures and Materials, vol. 5050, pp. 101-108, 2003.

Sodano, Henry A. et al., "Model of Piezoelectric Power Harvesting Beam", ASME International Mechanical Engineering Congress, Washington, D.C., pp. 1-10, Nov. 21, 2003.

Sodano, Henry A. et al., "A Review of Power Harvesting from Vibration using Piezoelectric Materials", The Shock and Vibration Digest, vol. 36, No. 3, pp. 197-205, May 2004.

* cited by examiner

ENERGY HARVESTING DEVICE

STATEMENT OF GOVERNMENT INTEREST

This invention was made with Government support under Grant No. R01 EB000720 awarded by the National Institutes of Health; the Government is therefore entitled to certain rights to this invention.

BACKGROUND OF THE INVENTION

1. Field of the Invention

The present invention relates to a device and method for generating, harvesting and storing energy. The invention may be used in applications in the portable microelectronic device industry or defense industry.

2. Description of the Related Technology

Traditional energy harvesting technologies include wind turbines and solar cells. These technologies, typically characterized by a dependency on unreliable power sources and large structures, are unsuitable for providing a steady stream of replenishable energy to microelectronic technologies. These technologies are also inefficient in converting and generating power. For example, the energy conversion efficiency of crystalline silicon solar cell modules is generally below 20% and closer to 10% for flexible amorphous silicon panels. A standard solar cell harvests about 100 mW/cm$^2$ in bright sunlight and about 100 µW/cm$^2$ in an illuminated office. At most, solar cells have been purported to generate up to 2 watts of power.

Mechanical and vibrational energy harvesters, by comparison, efficiently generate and store a constant stream of electrical charges. Energy harvesters incorporating piezoelectric materials are particularly effective for converting mechanical energy to electrical energy and, specifically, for converting ambient motion into electrical energy.

Current piezoelectric mechanical or vibrational energy harvesters may be classified as: (1) macro-scale energy harvesters, or (2) micro-scale energy harvesters. Macro-scale energy harvesters are usually fabricated from commercial lead zirconate titanate (PZT) or piezoelectric polymers, having a thickness of at least 127 µm. Typically, these devices generate hundreds of milliwatts (mW). Because macro-scale energy harvesters require a large surface area, on the order of several tens of cm$^2$, in order to maintain sufficient flexibility to generate power, they are generally incompatible with microelectronic devices.

U.S. Pat. No. 6,995,496 illustrates a typically macro-scale energy harvester. The patent discloses a vibration-based piezoelectric transducer capable of converting mechanical energy to electrical energy. The transducer is connected to a storage element such as a rechargeable battery or capacitor (See col. 6, line 15). In one embodiment, the transducer may be constructed from PZT having a thickness of 2 mm (See col. 7, lines 7-8). The transducer may also be constructed from PMN-PT or fine grain PZT (See col. 9, lines 38-43) and formed as a disk or sheet (See col. 9, line 51).

U.S. Pat. No. 5,801,475 also discloses a piezoelectric energy generation device capable of using piezoelectric vibrating plates and circuits to replenish voltage. The vibrating plates are connected in a circuit to a capacitor for charge collection. The device may be constructed in the form of a cantilever having a thickness of 0.5 mm (See col. 2, line 50, 54). As taught by U.S. Pat. No. 6,858,970, these piezoelectric cantilevers may be formed as an array (See abstract).

Micro-scale energy harvesters, typically fabricated from PZT thin films having a thickness of about 1 µM, produce less than 1 µW. Although these devices are of a suitable size to power microelectronic devices, they are typically unable to produce large amounts of power and suffer from energy conversion inefficiencies. Vibration-based devices typically generate only about 375 microwatts. Additionally, PZT-Al unimorphs, having Al and PZT components with respective thicknesses of 0.0024 in and 0.0105 in, were found to exhibit conversion efficiencies of about 1-4%. H. A. Sodano, G. Park, D. J. Leo, and D. J. Inman, "Use of Piezoelectric Energy Harvesting Devices for Charging Batteries," Smart Structure and Materials: Smart Sensor Technology and Measurement Systems, Proceedings of SPIE 5050, 101-108 (2003).

An example of a micro-scale energy harvester is disclosed in British Patent application publication no. 2,326,275, which teaches a piezoelectric generator constructed from an array of piezoelectric cantilevers that may be placed on an engine. The cantilevers are constructed from thin piezoelectric films and a non-piezoelectric substrate (See Abstract). In one embodiment, the thin piezoelectric film is constructed from PZT and has a thickness of about 1 µm (See Table 1).

U.S. Pat. No. 6,737,789 issued on May 18, 2004, discloses a force-activated electrical power generator which uses a lead-magnesium titanate (PMN-PT) piezoelectric element. This patent also discloses circuitry which is connected to the piezoelectric element and outputs an electrical charge which can be stored or employed as an energy source. It appears that the preferred embodiment of this patent employs bulk, single crystal lead-magnesium titanate for fabrication of the piezoelectric element.

There currently exists a need for energy harvesting devices capable of efficiently generating and converting mechanical energy to electrical energy to produce a large and steady stream of power for microelectronic devices. The vibration-based energy harvesting device should be characterized by: (1) a high electromechanical coupling to convert the vibrations into surface charges, (2) a sufficiently thin and flexible piezoelectric cantilever to amplify the mechanical vibration and enhance energy conversion, (3) a sufficiently thick piezoelectric cantilever to maintain a large enough output voltage and hence power, and (4) a sufficiently large capacitance to generate large amounts of power and high current flow.

SUMMARY OF THE INVENTION

In a first aspect, the invention is directed to an efficient piezoelectric energy harvesting device for converting ambient vibrational/mechanical energy into electricity. The device includes a conducting element, a piezoelectric layer and a non-piezoelectric layer. The device may be constructed from piezoelectric lead magnesium niobate-lead titanate $(Pb(Mg_{1/3}Nb_{2/3})O_3)_{0.65}$-$(PbTiO_3)_{0.35}$ $(PMN_{0.65}$-$PT_{0.35})$ (PMN-PT), which typically has a thickness of about 1 µm-about 150 µm with a piezoelectric coefficient of at least 2000 pm/V at high electric fields.

In a second aspect, the piezoelectric layer of the microcantilever is constructed from lead zirconate titanate (PZT)/SiO$_2$ which typically has a thickness of about 1 µm-about 150 µm with a piezoelectric constant of at least 2000 pm/V at high electric fields.

In a third aspect, the device further includes a driving element capable of driving the piezoelectric energy harvesting device at or about a resonance frequency.

In a fourth aspect, the present invention is directed to a method for converting ambient vibrational or mechanical energy into electricity using one of the devices of the present invention.

DETAILED DESCRIPTION OF THE PREFERRED EMBODIMENTS

The present invention is directed to an efficient piezoelectric energy-harvesting device (PEHD) and a method for converting ambient vibrational or mechanical energy into electricity. When a vibrational or mechanical force is applied to the PEHD, the device becomes strained and generates an electrical charge, which may be collected and stored for later use.

Figure 1:
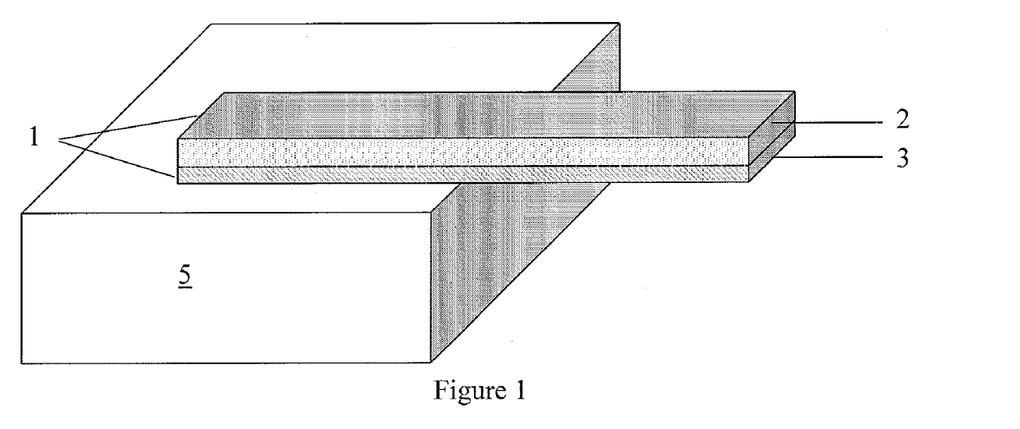
FIG. 1 depicts one embodiment of a piezoelectric energy-harvesting device (PEHD) in accordance with the present invention.

FIG. 1 shows one embodiment of a PEHD in accordance with the present invention including a conductive element 1, a piezoelectric layer 2 and a non-piezoelectric layer 3. The PEHD may be constructed as a cantilever, disk or according to any other conventional form. In a preferred embodiment, the PEHD is shaped like a disk, which is capable of sustaining high mechanical loads and is particularly suitable for applications subject to significant wear.

The conductive element 1 may be any element capable of conducting an electrical charge from the piezoelectric layer 2 to a device for storing or utilizing said electrical charge. In a preferred embodiment, the conductive element 1 is an electrode, which may be constructed from any suitable conductive material and may include one or more electrical connections for connecting the electrode to a device that stores or consumes electrical energy. In another embodiment conductive element 1 is merely an electrical connection for connecting piezoelectric layer 2 to a device for storing or utilizing electrical energy. One example of suitable circuitry for transporting energy from the piezoelectric material to an energy storage device or a device that uses the energy is described in U.S. Pat. No. 6,737,789, the disclosure of which is hereby incorporated by reference for its description of circuitry useful in the present device. The piezoelectric layer 2 may be fabricated from any highly piezoelectric material, preferably lead zirconate titanate (PZT) or lead magnesium niobate-lead titanate, $(PbMg_{1/2}Nb_{2/3}O_3)_{0.63}$-$(PbTiO_3)_{0.37}$ (PMN-PT). The piezoelectric layer 2 is preferably formed from thin piezoelectric freestanding films generally characterized by large piezoelectric coefficients and dielectric constants, emulating or exceeding that of bulk PZT and bulk PMN-PT. When placed under high stress, the large piezoelectric coefficients, $d_{31}$ and especially $g_{31}$, amplify the electromagnetic coupling and enable effective conversion of mechanical energy to electrical energy. The enhanced piezoelectric coefficient also increases vibration amplitude and energy production. Incorporating such highly piezoelectric thin films in the present devices enables the generation of 1 to a few watts of power.

Freestanding piezoelectric films may be made by any suitable method such as by tape casting. In a preferred embodiment, tape casting is followed by a step of burning out the organics to leave primarily piezoelectric material. The freestanding films are made without a substrate attached thereto. Non-piezoelectric or other layers may then be bonded to the freestanding film or cast on the freestanding film, if desired. Without being bound by theory, it is thought that the fabrication of the piezoelectric layer as a freestanding film may result in the provision of enhanced properties useful in energy harvesting.

These freestanding films exhibit piezoelectric properties comparable to specially cut single crystals without the bulkiness and processing difficulties associated with single crystals in MEMS miniaturization. The piezoelectric layer 2 is preferably formed with a thickness of about 1 μm-about 150 μm and, more preferably, 8 μm-about 127 μm. Thicknesses of 1-150 μm offer a good combination of device flexibility for amplification of vibrational amplitude, higher piezoelectric stresses and excellent capacitance. These thin films have an optimal area to thickness ratio which provide a large capacitance for surface charge generation and hence voltage generation. Electrical charges generated by PEHDs are directly proportional to the capacitance of the piezoelectric layer 2, which is inversely proportional to the thickness of the piezoelectric layer 2. By reducing the thickness of the piezoelectric layer 2, the amount of charge, induced voltage, and current flow generated by mechanical vibrations is dramatically increased. In addition to the capacitance effect, the fabrication of thin piezoelectric films also produces high piezoelectric stresses, which increases the piezoelectric charge.

In a preferred embodiment, the piezoelectric layer is constructed from PMN-PT freestanding films having a thickness in the range of 8-127 μm. These films exhibit enhanced piezoelectric $-d_{31}$ coefficients of about 2000 pm/V at high electric fields of about E=10 kV/cm, e.g. E=8-12 kV/cm, larger than that of commercial single crystalline PMN-PT and seven times larger than commercial bulk PZT5H, the bulk counterpart of PMN-PT, and commercial bulk PMN-PT, as shown in Table I. Additionally, because the dielectric constant of the PMN-PT films decreases with increasing electric fields, PMN-PT films also have a high $-g_{31}$ coefficient. The exceptionally high $-d_{31}$ and $-g_{31}$ coefficients of Table I make PMN-PT thin films ideal for both actuation and voltage generation.

In addition to the exceptional performance at higher fields, Table I shows that PMN-PT films also have larger $-d_{31}$, $-g_{31}$ and $k_{31}$ coefficients than that of its bulk counterpart, commercial PZT, and commercial PMN-PT at low fields. Due to the large $-d_{31}$ coefficient and small dielectric constant E, the $-g_{31}$ coefficient of PMN-PT films are more than 14 times larger than that of the commercial PZT, ideal for energy harvesting applications. The PMN-PT freestanding films therefore have enhanced piezoelectric coefficients capable of providing 14 times more charges than commercial PZT under the same conditions.

TABLE I

Piezoelectric properties of 22-μm thick PMN-PT37 freestanding films. Also listed are the piezoelectric properties of bulk PMN-PT37, commercial PZT, and commercial PMN-PT35

| | PZT[1] (PSI-5H4E) | PMN-PT (37) freestanding film at low field | PMN-PT (37) freestanding film at E = 10 kV/cm | Own Bulk PMN-PT (37) | PMN-PT(35) (EDO, EC-98) | PMN-PT 010 single crystals[2] |
|---|---|---|---|---|---|---|
| $\epsilon_I$ | 3800 | 2100 | 1700 | 2100 | 5500 | 4600 |
| $Y_{11}$ (GPa) | 62 | 80 | | 81 | 61 | 25 |
| $d_{31}$ (pm/V) | −320 pm/V | −390 | −2100 | −210 | −312 | −930 |
| $g_{31}$ (Vm/N) | −0.0095 | −0.021 | −0.137 | −0.0062 | −0.0064 | −0.023 |
| $K_{31}$ | 0.44 | 0.75 | | 0.24 | 0.35 | 0.72 |

[1] = PSI-5H4E, Piezo Systems, Inc., Cambridge, MA 02139, http://www.piezo.com/
[2] = http://www.americanpiezo.com/products_services/crystals/PMN-PT.html Due to their ceramic properties, freestanding PMN-PT films are capable of producing exceptionally large strain values from the application of relatively small voltages; a strain rate of 0.3% may be produced upon application of an applied electric field (E) of from about 8 kV/cm to about 12 kV/cm (8 kV for 8 μm thick films). Moreover, an un-poled freestanding film exhibited a strain value of higher than 3% upon application of 10 kV/cm. These results therefore indicate that the freestanding PMN-PT films have superior piezoelectric characteristics as well as outstanding mechanical strength.

Additionally, because electric fields and stresses induce the same characteristics in highly piezoelectric materials, either the application of an electric field or mechanical stress will produce a large $d_{31}$ coefficient. The ability to produce a large $d_{31}$ coefficient from applied stress is desirable for mechanical energy harvesting, since the PEHD converts mechanical stresses into electrical charges.

The piezoelectric layer 2 is bound to a non-piezoelectric layer 3. Preferably, the ratio of the thicknesses of the layers 2, 3 is optimized to maximize the charge output. The ratio of the thickness of the non-piezoelectric layer to the thickness of the piezoelectric layer may be from about 0.04 to about 12.5, and more preferably from about 0.05 to about 6.25. The non-piezoelectric layer 3 may be constructed from any non-piezoelectric material, preferably stainless steel. The piezoelectric and non-piezoelectric bi-layer design is employed to amplify displacement thereby creating larger induced voltages. In one embodiment, piezoelectric layer 2 and non-piezoelectric layer 3 each have the same length. In another embodiment, piezoelectric layer 2 and non-piezoelectric layer 3 each have different lengths.

Figure 2A:
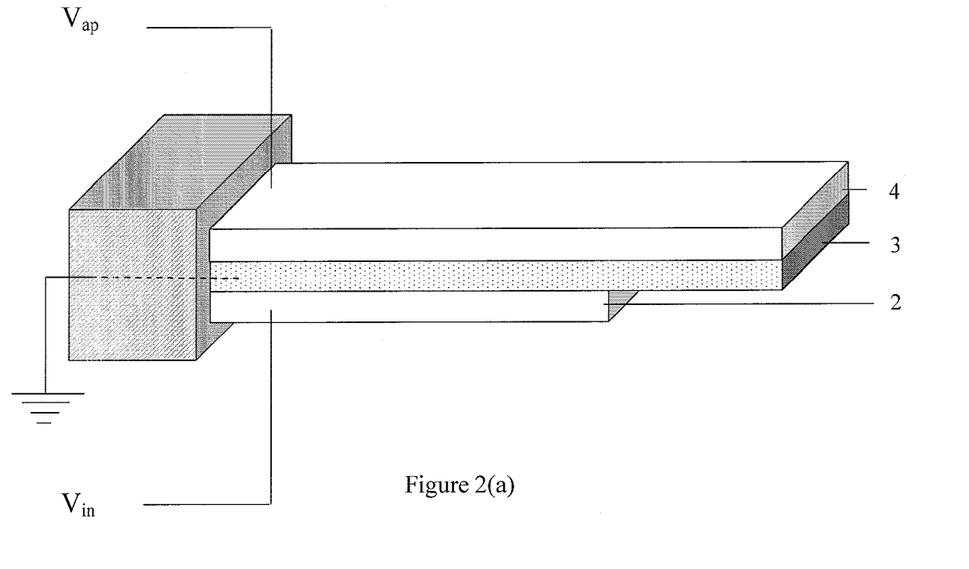
FIG. 2(a) depicts another embodiment of a PEHD with an additional piezoelectric layer.
Figure 2B:
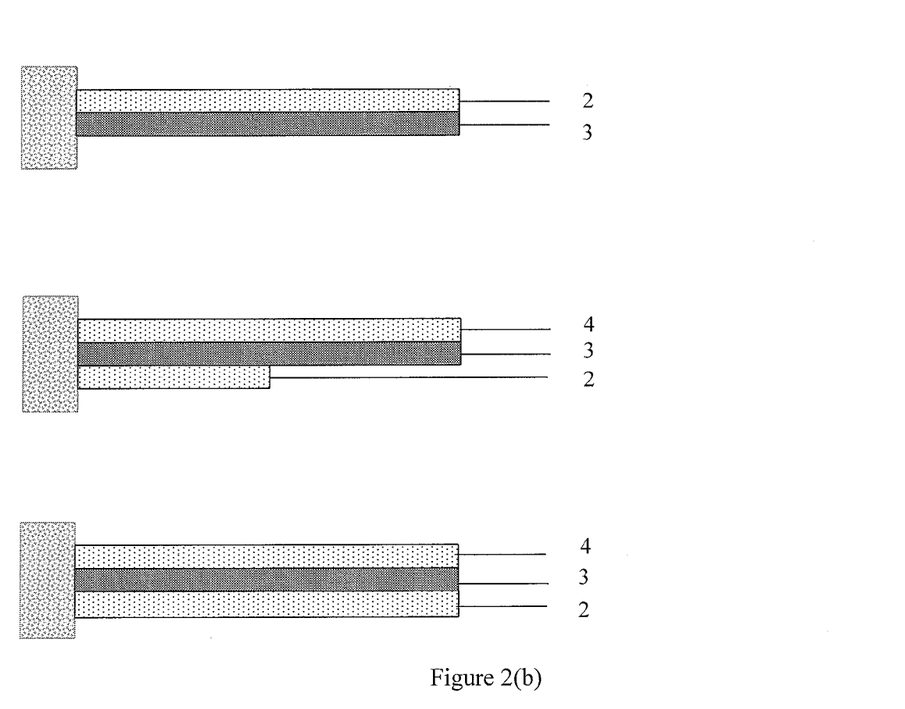
FIG. 2(b) depicts three different configurations of cantilevers that can be employed in the present invention.

In the preferred embodiment of FIG. 2, the PEHD may further include a driving element 4. The driving element 4 may include any object capable of driving the piezoelectric layer 2 at a specific resonance frequency. This may be accomplished magnetically, electrically or by any other conventional means known in the art. In a preferred embodiment, the driving element is an additional piezoelectric layer 4, which serves to actuate the PEHD. This layer 4 may be used to actuate the PEHD at its resonance frequency to improve the power output of the device. In some embodiments, the power output may be improved by a faction of 2-150 by actuation at the resonance frequency. Thus, in one example, the power output was improved from 0.008 mW at a non-resonance frequency to 1.2 mW at a resonance frequency. In one embodiment, first piezoelectric layer 2, second piezoelectric layer 4 and non-piezoelectric layer 3 may all have the same length. In other embodiments, two or more of first piezoelectric layer 2, second piezoelectric layer 4 and non-piezoelectric layer 3 may have different lengths, or any two of these layers 2, 3, 4 may have the same length and the third may have a different length.

The PEHD operates by bending under an applied mechanical or vibrational force. When the piezoelectric layer 2 becomes strained, it generates a charge at the surface of the conducting element 1 of the piezoelectric layer 2, which may be subsequently collected and stored in a capacitor, battery or a combination thereof. To maximize charge output by amplifying mechanical vibrations, the PEHD may be set to vibrate at its resonance frequency, irrespective of the ambient vibration frequency. When operating a PEHD having an additional piezoelectric actuation layer 4, an alternating current may be applied to the actuating layer 4 to cause the PEHD to vibrate at its resonance frequency.

The PEHD may be formed as part of an array, capable of harvesting energy from a diverse or specific range of vibrational frequencies. The array functions by harnessing the summation of all the charges generated by individual PEHD. For example, an array having 10 piezoelectric energy harvesting cantilevers of the present invention is capable of producing about 10 W, which may be used to power a lap-top computer. PEHD arrays enable power amplification and efficient energy collection. Similar to the individual PEHD, the arrays may be lightweight, small, and easily portable. Advantageously, the PEHD fabrication procedure lends itself to assembly and manufacture of vertical and/or horizontal arrays. Additionally, the inexpensive piezoelectric thin film tape casting fabrication method enables economical mass production of PEHD and PEHD arrays.

The PEHD and PEHD arrays of the present invention may be used in a number of microelectronics and defense applications. The PEHD may be used to harvest energy from natural forces such as winds and water streams as well as human motions or machinery/vehicle vibrations. Any mechanical energy source may be exploited as a PEHD power source. The harvested energy may be used to replace, charge or prolong the life of batteries used in portable electronic devices, such as cell phones and palm pilots, microelectronic devices, lap-top computers, etc.

EXAMPLES

Example 1

FIG. 1 shows a PEHD fabricated from a PZT thin film and a layer of stainless 1.5 steel with a thickness ratio designed to maximize the charge output. In one embodiment, the PZT thin film was about 127 μm thick.

In another embodiment, the PZT thin film had a thickness of about 127 μm, and the non-piezoelectric layer had a thickness of about 50 μm. The piezoelectric layer and a non-piezoelectric layer were approximately 5 mm-about 10 mm in width and extend beyond a substrate 5 by about 0.5 cm-about 2 cm. The resultant PEHD produced about 10 mW of power from vibration amplitudes of only a few microns.

Example 2

Figure 3:
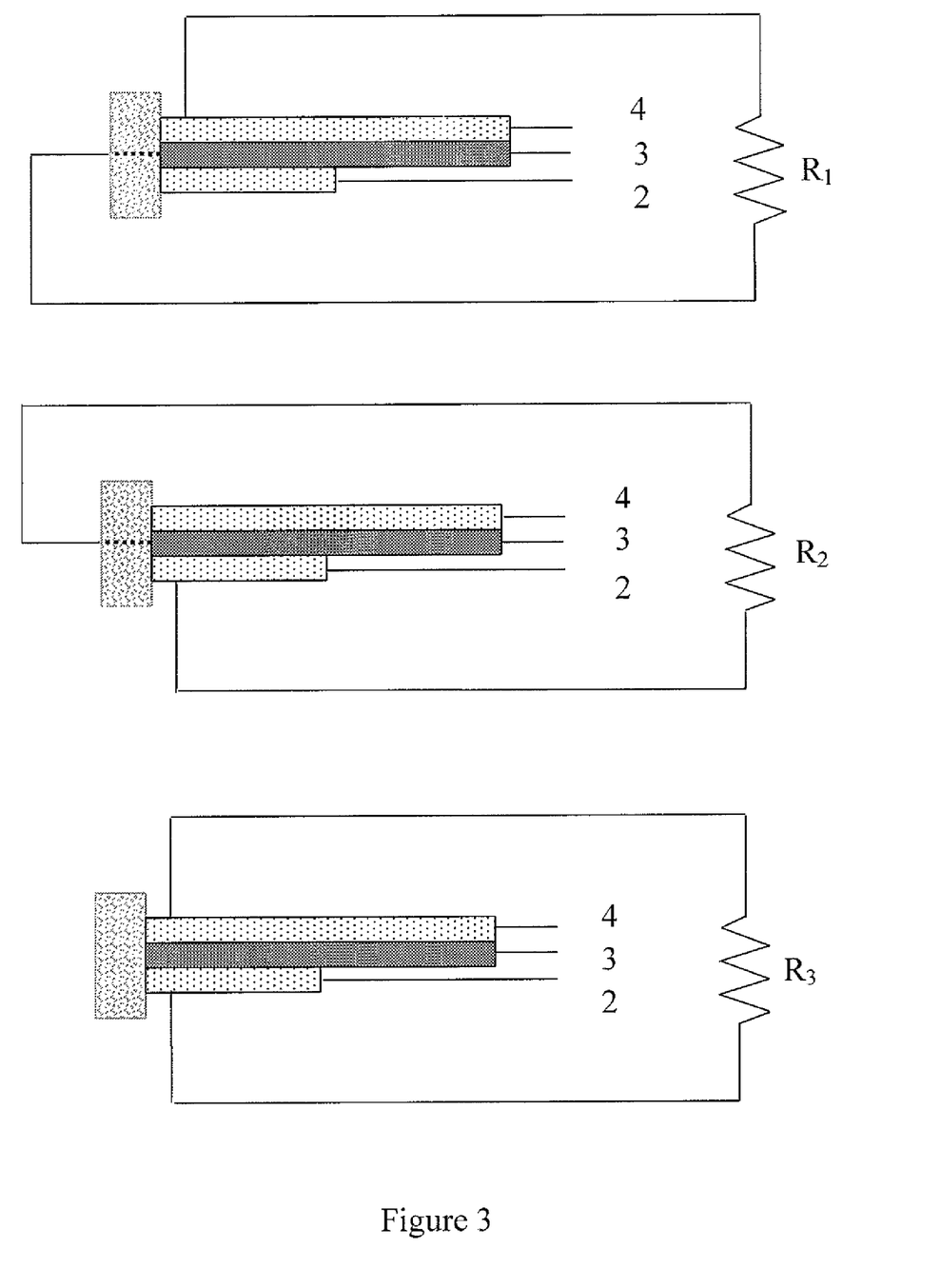
FIG. 3 is a schematic of three different power generation circuits incorporating a PEHD.

To mimic the external vibration forces, an additional PZT layer was bonded to the PEHD to serve as an actuating layer, as shown in FIG. 2. The fabricated PEHD was about 2 cm long and 8 mm wide with a 1.4 cm long actuating PZT layer of the same width. FIG. 2 shows a PEHD with a piezoelectric driving layer 4. An alternating voltage was applied to the actuating layer 4 at the resonance frequency of the PEHD, 273 Hz, to mimic the application of vibrational energy and operate the PEHD at its resonance frequency. The piezoelectric voltage generated across the conducting PZT layer 1 was used to power a resistor and capacitor circuit, as schematically shown in FIG. 3. The output power across the resistor was determined by monitoring the voltage drop across the resistor using an oscilloscope. Capacitance was set to 10 nF, corresponding to a resistance of 53 kΩ, and the conducting PZT layer 1 had a capacitance of 44 nF.

Figure 4:
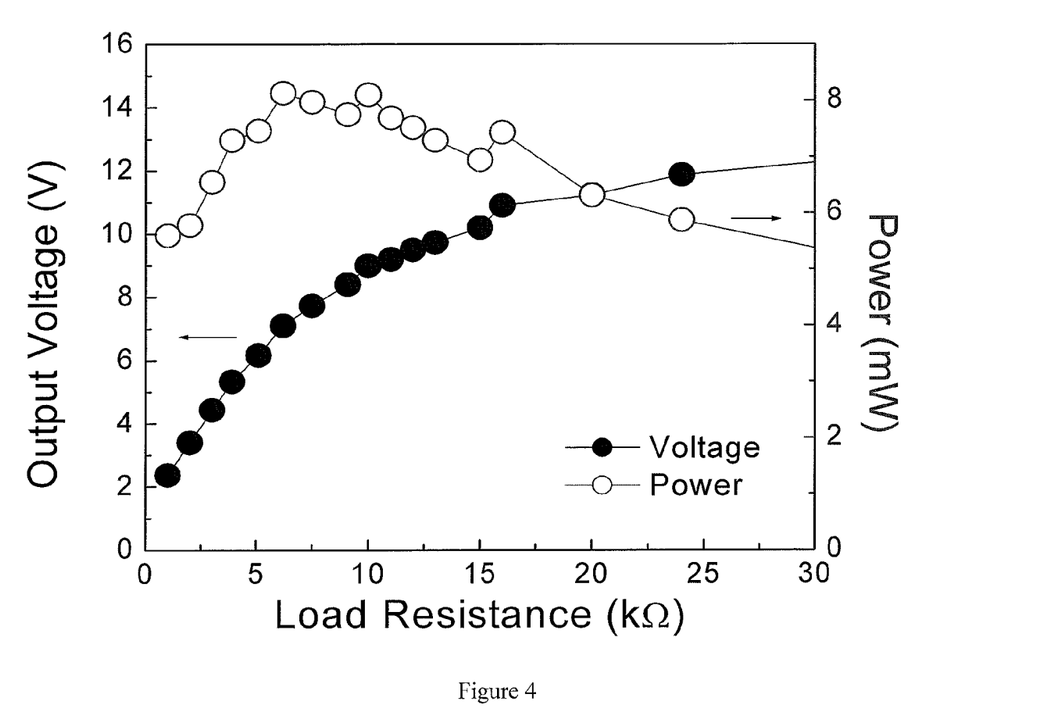
FIG. 4 is graph of output voltage versus load resistance for a PEHD subjected to an applied voltage of 50 V at 273 Hz on its actuation layer.

An alternating current of 50 V was applied to the driving PZT layer at 273 Hz. FIG. 4 is a graph of the recorded voltage drop and the power consumed across the load resistor versus the load resistance. The tip displacement amplitude at the maximum power output was about 12 μm. Table II discloses the various means of operating the PEHD. The resultant PEHD produced about 10 mW of power from vibration amplitudes of only a few microns.

TABLE II

Performance of a PEHD including a driving element operated at several different modes.

| Experiment | Applied Voltage (V) | Maximum Power (mW) |
| --- | --- | --- |
| PEHD, actuated from the driving PZT layer | 15 V at 300 Hz | 2.1 |
| PEHD, actuated from the driving PZT layer | 50 V at 273 Hz | 8.1 |

Example 3

Figure 5:
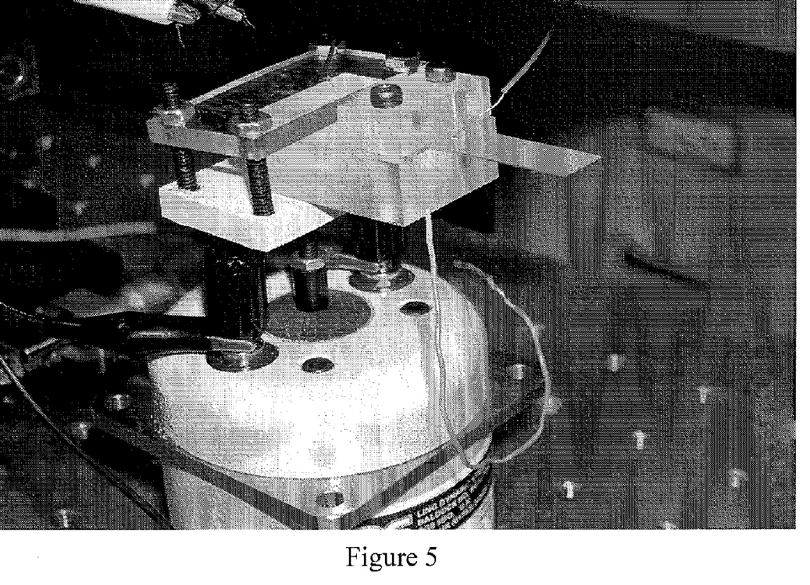
FIG. 5 shows a PEHD mounted on a shaker wire attached to measure the induced voltage and generated power.
Figure 6:
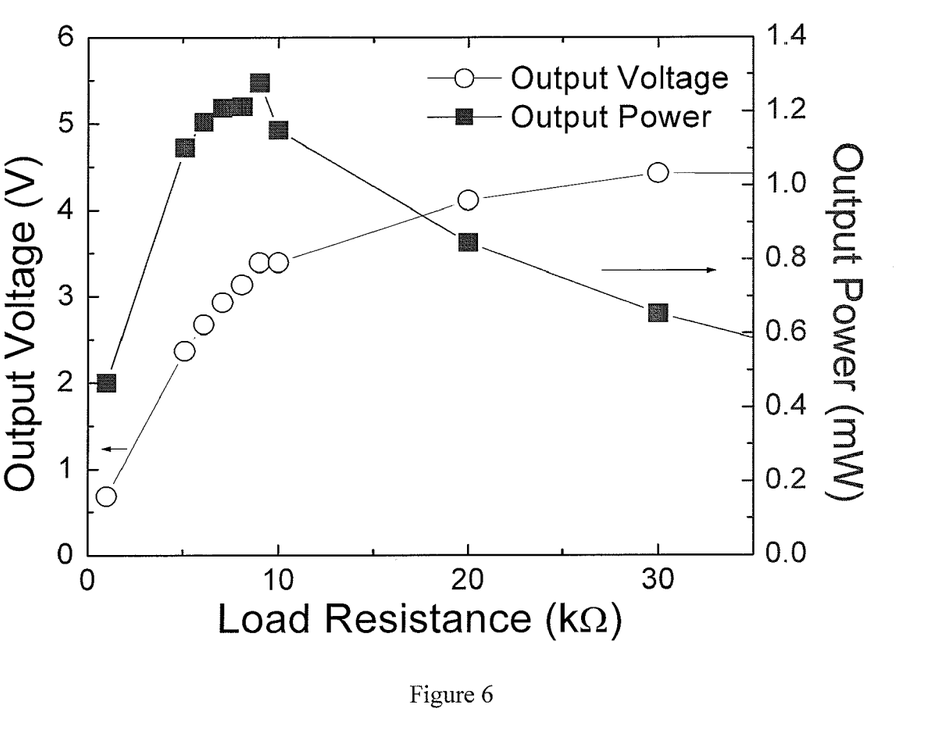
FIG. 6 is a graph of output voltage versus load resistance for 10 mm wide PZT cantilever at 329 Hz.

FIG. 5 shows a PEHD having a driving element mounted on a standard commercial shaker The PEHD measured 2.7 cm long and 10 mm wide and also included a 1.2 cm long and 10 mm wide PZT actuation layer. The sensing PZT layer has a capacitance of 31.8 nF. The measured voltage and generated power across the load resistor was solely dependent on the vibration frequency and amplitude of the shaker and load resistance. FIG. 6 graphs the output voltage and power versus load resistance. Voltage and power output were maximized at a frequency of 329 Hz. The base vibration amplitude, measured with a laser displacement meter, was 1.5 μm. The results show that at a base vibration amplitude of 1.5 μm, a maximum power output of 1.2 mW was obtained.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

The invention claimed is:

1. A piezoelectric energy harvesting system comprising:
   a cantilever, wherein the cantilever comprises:
     a conducting element;
     a first piezoelectric layer constructed from a freestanding piezoelectric film, wherein said first piezoelectric layer has a thickness of about 1 μm-about 150 μm;
     a non-piezoelectric layer;
     a second piezoelectric layer; and
     a device for applying an alternating current to said second piezoelectric layer; and
   a device connected to the cantilever for storing or consuming energy harvested by the cantilever, wherein the device for storing or consuming energy harvested by the cantilever.

2. The system of claim 1, wherein said piezoelectric layer has a thickness of about 8 μm-about 127 μm.

3. The system of claim 1, wherein said first piezoelectric layer comprises a material selected from the group consisting of PZT and PMN-PT.

4. The system of claim 1, wherein said second piezoelectric layer has a different length from the first piezoelectric layer.

5. The system of claim 1, wherein said cantilever is capable of operation at a resonance frequency of the first piezoelectric layer.

6. The system of claim 1, wherein said cantilever is capable of operation at two or more resonance frequencies of the first piezoelectric layer.

7. The system of claim 1, wherein said piezoelectric layer and said non-piezoelectric layer have different lengths.

8. The system of claim 1, wherein a ratio of a thickness of the piezoelectric layer to a thickness of the non-piezoelectric layer is from about 0.04 to about 12.5.

9. A piezoelectric energy harvesting system comprising:
   a cantilever, wherein the cantilever comprises:
     a conducting element;
     at least a first piezoelectric layer which is a PMN-PT freestanding film having a thickness of about 1 μm-about 150 μm; and
     a non-piezoelectric layer; and
   a device connected to the cantilever for storing or consuming energy harvested by the cantilever.

10. The system of claim 9, wherein said piezoelectric layer and said non-piezoelectric layer have different lengths.

11. The system of claim 9, wherein a ratio of a thickness of the piezoelectric layer to a thickness of the non-piezoelectric layer is from about 0.04 to about 12.5.

12. The system of claim 9, wherein the PMN-PT freestanding film has a piezoelectric coefficient $-d_{31}$ of at least about 2000 pm/V at E=about 10 kV/cm.

13. The system of claim 12, wherein the dielectric constant of the PMN-PT freestanding film decreases with increasing electric field.

14. The system of claim 13, wherein the PMN-PT freestanding film has a strain of at least 0.3% upon applying an electric field of from about 8 kV/cm to about 12 kV/cm.

15. The system of claim 13, wherein the PMN-PT freestanding film is unpoled and has a strain of at least 3% upon applying an electric field of about 10 kV/cm.

16. The system of claim 9, comprising a plurality of cantilevers that form an array, and wherein each of said cantilevers is electrically connected to the device for storing or using electrical energy.

17. A method for harvesting energy comprising the steps of:
   a. exposing at least one piezoelectric cantilever to a mechanical or vibrational force, wherein the piezoelectric cantilever comprises:
      a driving element;
      a first piezoelectric layer constructed from a freestanding piezoelectric film and having a thickness of about 1 μm-about 150 μm; a conductive element;
      a non-piezoelectric layer; and a second piezoelectric layer;
   b. and the method further comprises the step of applying an alternating voltage to said second piezoelectric layer to operate said cantilever at frequency which is about a resonance frequency of said first piezoelectric layer;
   c. harvesting electrical energy generated by the cantilever from the exposure to the mechanical or vibrational force; and
   d. transporting the electrical energy to a device, wherein the electrical energy is stored or consumed by the device.

18. The method of claim 17, wherein the electrical energy is stored by the device.

19. The method of claim 17, wherein a ratio of a thickness of said first piezoelectric layer to a thickness of said non-piezoelectric layer is from about 0.04 to about 12.5.

20. The method of claim 19, wherein the first piezoelectric layer is a PMN-PT freestanding film having a piezoelectric coefficient $-d_{31}$ of at least about 2000 pm/V at E=about 10 kV/cm.

* * * * *